(12) United States Patent
Wong et al.

(10) Patent No.: US 9,342,110 B2
(45) Date of Patent: May 17, 2016

(54) HEAT DISSIPATING DEVICE

(75) Inventors: Chun-Chieh Wong, Taipei (TW); Cheng-Yu Wang, Taipei (TW)

(73) Assignee: ASUSTEK COMPUTER INC., Taipei (TW)

( * ) Notice: Subject to any disclaimer, the term of this patent is extended or adjusted under 35 U.S.C. 154(b) by 970 days.

(21) Appl. No.: 13/300,132

(22) Filed: Nov. 18, 2011

(65) Prior Publication Data

US 2012/0138284 A1    Jun. 7, 2012

Related U.S. Application Data

(60) Provisional application No. 61/420,326, filed on Dec. 7, 2010.

(51) Int. Cl.
| | |
|---|---|
| *F28F 7/00* | (2006.01) |
| *G06F 1/16* | (2006.01) |
| *H01L 23/467* | (2006.01) |
| *H05K 7/20* | (2006.01) |
| *F28F 3/02* | (2006.01) |

(52) U.S. Cl.
    CPC ............ *G06F 1/1658* (2013.01); *H01L 23/467* (2013.01); *H05K 7/2039* (2013.01); *F28F 3/027* (2013.01)

(58) Field of Classification Search
    CPC ........ G06F 1/1658; F28F 3/027; F28F 21/02; H05K 7/2039; H05K 7/20154; H01L 23/467
    USPC .................. 165/80.3, 185; 361/690, 704, 697
    See application file for complete search history.

(56) References Cited

U.S. PATENT DOCUMENTS

| | | | | |
|---|---|---|---|---|
| 5,406,451 A | * | 4/1995 | Korinsky | ...................... 361/697 |
| 6,308,771 B1 | * | 10/2001 | Tavassoli | ...................... 165/80.3 |
| 7,191,822 B2 | * | 3/2007 | Huang et al. | .................. 165/80.3 |
| 2002/0189790 A1 | * | 12/2002 | Wong | ........................... 165/80.3 |

FOREIGN PATENT DOCUMENTS

| | | |
|---|---|---|
| CN | 1722056 A | 1/2006 |
| CN | 1937213 A | 3/2007 |
| CN | 201589564 U | 9/2010 |
| TW | M246993 U | 10/2004 |
| TW | 200537278 A | 11/2005 |
| TW | 200601021 A | 1/2006 |

* cited by examiner

*Primary Examiner* — Marc Norman
*Assistant Examiner* — Jon T Schermerhorn
(74) *Attorney, Agent, or Firm* — Muncy, Geissler, Olds & Lowe, P.C.

(57) ABSTRACT

A heat dissipating device includes a supporting part, a plurality of first fins and a plurality of second fins. The first fins are disposed in a vertical array at the supporting part. The second fins are disposed in an inclined array at the supporting part. The first fins and the second fins are staggeredly disposed and adjacent to each other correspondingly. The heat exchange efficiency of the fins is improved so as to increase the heat dissipating efficiency of the heat dissipating device.

6 Claims, 10 Drawing Sheets

HEAT DISSIPATING DEVICE

CROSS REFERENCE TO RELATED APPLICATIONS

The non-provisional patent application claims priority to U.S. provisional patent application with Ser. No. 61/420,326 filed on Dec. 7, 2010. This and all other extrinsic materials discussed herein are incorporated by reference in their entirety.

BACKGROUND OF THE INVENTION

1. Field of Invention

The invention relates to a heat dissipating device and, more particularly, to a heat dissipating device including a plurality of fins.

2. Related Art

A heat dissipating module of a notebook computer mainly includes a fan, a heat pipe and a plurality of heat dissipating elements. The heat dissipating module includes a plurality of fins and is connected to a cooling end of the heat pipe. When heat is transmitted from the heat pipe to the heat dissipating module, the fan is used to blow cooling air into the fins to dissipate heat of the computer system. As the notebook computer efficiency improves, the heat dissipating efficiency of the heat dissipating module also should be improved.

FIG. 1A and FIG. 1B are schematic diagrams showing a conventional heat dissipating module 1 including a plurality of fins 11 arranged in array, respectively. A flow channel D is formed between any two of the fins 11. The fan blows cooling air into the flow channel D between the fins 11, and the cooling air exchanges heat with each of the fins 11 to dissipate heat.

However, the conventional fins 11 are vertical array disposed at the heat dissipating module 1. When the cooling air flows through the flow channel D between two fins 11, a boundary layer is formed at the surface of the fins 11 due to the effect of surface force, and fluid of the boundary layer forms stable laminar flow. The heat boundary layer of the stable laminar flow is constant relative to the turbulent flow. Thus, convection coefficient of the fins 11 is small, heat exchange efficiency of the fins 11 is low, and heat dissipating efficiency of the heat dissipating device 1 is low.

SUMMARY OF THE INVENTION

The heat dissipating device includes a supporting part, a plurality of first fins and a plurality of second fins. The first fins are disposed in a vertical array at the supporting part. The second fins are disposed in an inclined array at the supporting part. The first fins and the second fins are staggeredly disposed and adjacent to each other correspondingly.

The heat dissipating device further includes a connecting part. The connecting part connecting the supporting part with the first fins, and the connecting part connecting the supporting part with the second fins. The supporting part, the connecting part and the first fins are integratedly formed, or the supporting part, the connecting part and the second fins are integrated formed.

A first angle is formed between the second fins and a vertical plane, and the first fins are staggeredly relative to the inclined second fins. Moreover, a flow channel is formed between two second fins, and between two first fins for fluid to flow through.

These and other features, aspects and advantages of the present invention will become better understood with regard to the following description, appended claims, and accompanying drawings.

DETAILED DESCRIPTION OF THE INVENTION

A heat dissipating device is illustrated with relating figures, and the same symbols denote the same components.

Figure 1B:
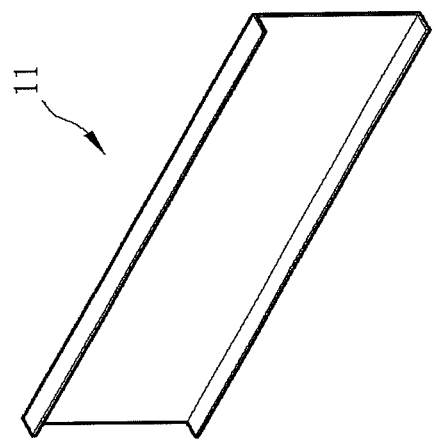
FIG. 1A and FIG. 1B are schematic diagrams showing a conventional heat dissipating module and its fins, respectively.
Figure 1A:
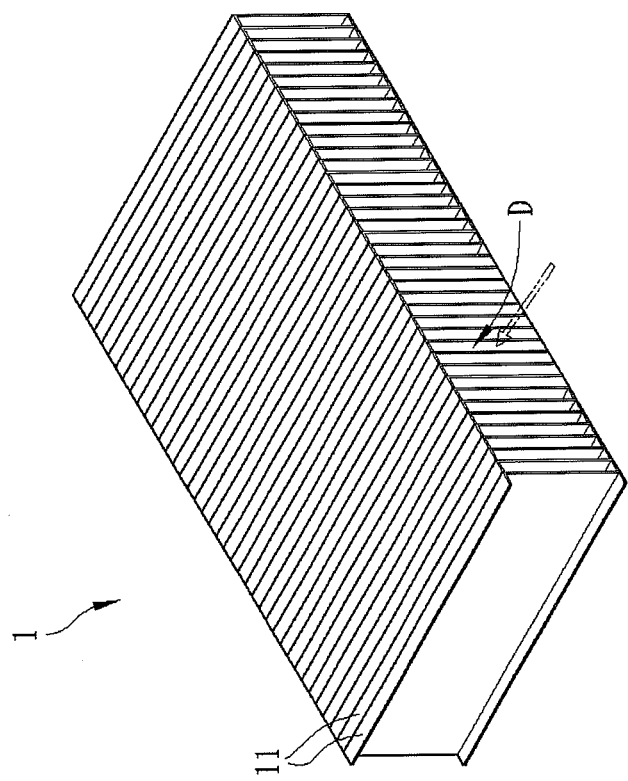
Figure 2A:
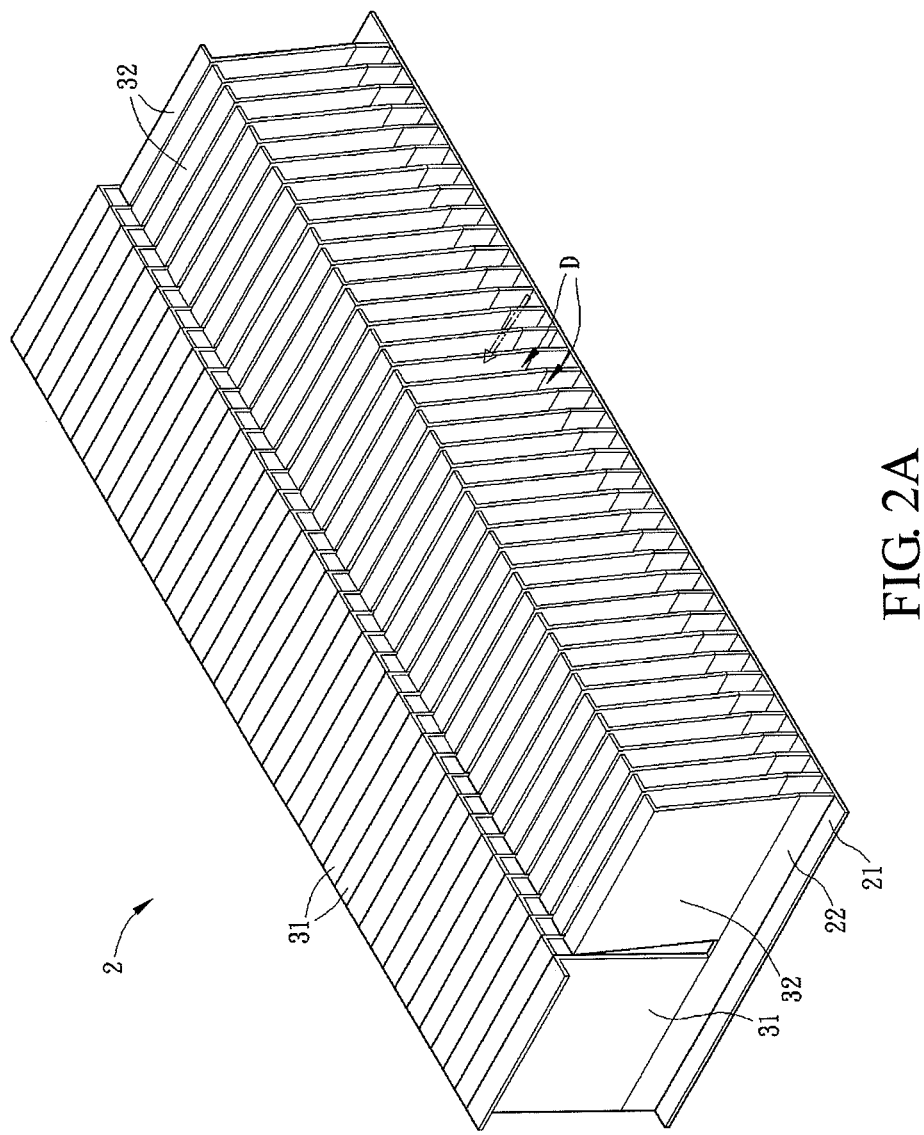
FIG. 2A and FIG. 2B are schematic diagrams showing a heat dissipating device and its fins, respectively, in a first embodiment.
Figure 2C:
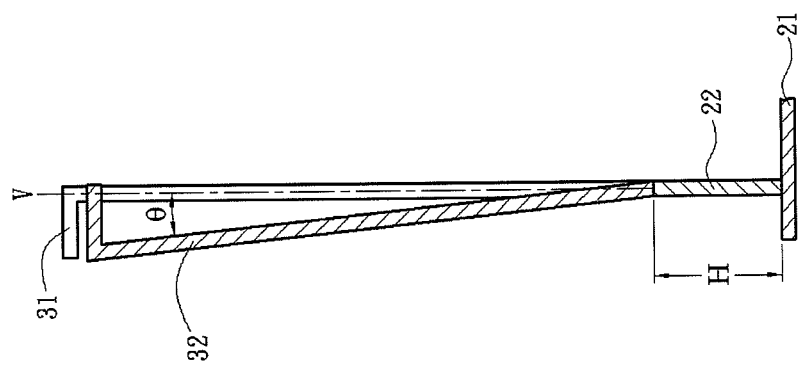
FIG. 2C is a sectional schematic diagram showing a fin in FIG. 2B along a straight line A-A.
Figure 2B:
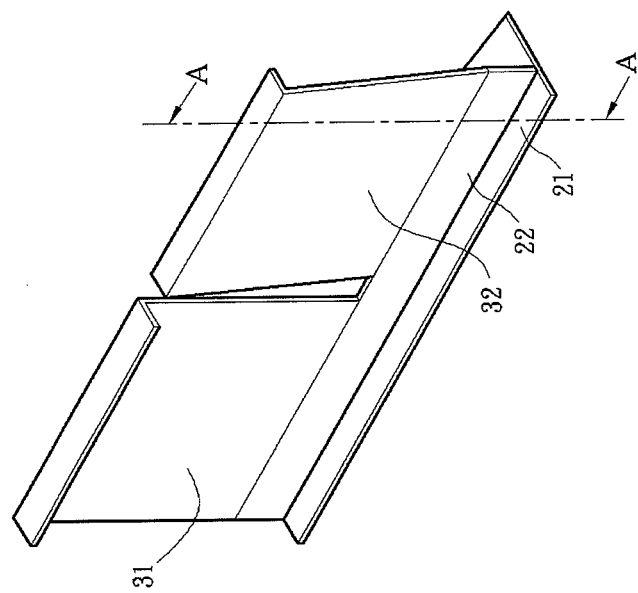

FIG. 2A and FIG. 2B are schematic diagrams showing a heat dissipating device 2 and its fins, respectively, in a first embodiment. In order to illustrate the structure of the heat dissipating device 2 more clearly, only a supporting part 21, a connecting part 22 and first fins 31, second fins 32 are shown in FIG. 2B.

In FIG. 2A, the heat dissipating device 2 includes a supporting part 21, a vertical heat dissipating part, an inclined heat dissipating part and a connecting part 22.

The vertical heat dissipating part includes a plurality of first fins 31, and the first fins 31 are disposed in a vertical array at the supporting part 21 via the connecting part 22 (the vertical array). The inclined heat dissipating part is disposed adjacent to the vertical heat dissipating part and includes a plurality of the second fins 32 (the inclined array). The second fins 32 are disposed in an inclined array at the supporting part 21 via the connecting part 22.

The supporting part 21, the connecting part 22 and the first fins 31 may be integratedly formed, or the supporting part 21, the connecting part 22 and the second fins 32 may be integratedly formed. Furthermore, the supporting part 21, the connecting part 22 and the first fins 31, the second fins 32 may also be independent components, and they are assembled together to form the heat dissipating device 2. For example, the first fins 31, the second fins 32, the connecting part 22 and the supporting part 21 are independent components and are welded together to form the heat dissipating device 2, which is not limited herein. Material of the heat dissipating device 2 may be metal or alloy. Aluminum with a higher thermal conductivity can dissipate heat rapidly.

The first fins 31 and the second fins 32 are staggeredly disposed and adjacent to each other correspondingly. In other words, as shown in FIG. 2B, each of the first fins 31 corresponds to the adjacent second fin 32, and each of the first fins 31 is disposed staggeredly to the corresponding second fin 32. Moreover, the first fins 31 are disposed staggeredly respect to the inclined second fins 32.

FIG. 2C is a sectional schematic diagram showing a fin in FIG. 2B along a straight line A-A. The first fins 31 are disposed vertically at the supporting part 21 via the connecting part 22. The second fins 32 are disposed adjacent to the first fins 31, and the second fins 32 are disposed inclinedly at the supporting part 21 via the connecting part 22. An angle θ is formed between the second fins 32 and a vertical plane V, and in an embodiment, the angle θ is between 5 degrees to 30 degrees. In an embodiment, the second fins 32 may be shaped in an arc (that is, the second fins 32 are arc-shaped). Furthermore, a height H of the connecting part 22 is between 0.5 mm to 2 mm, which is not limited herein.

In FIG. 2A, a flow channel D is formed between any two adjacent second fins 32 and between any two adjacent first fins 31 for fluid to flow through. In an embodiment, the fluid enters the flow channel D from one side of the second fins 32 of the inclined heat dissipating part, and flows through two first fins 31 of the vertical heat dissipating part and two second fins 32 of the inclined heat dissipating part, and then gets out from one side of the first fins 31. The fluid may be cooling air. The fluid flows through the flow channel D to take the heat of the heat dissipating device 2 away, and thus to decrease temperature of the heat dissipating device 2. Specifically, since the first fins 31 are disposed vertically, when the fluid flows out from two first fins 31, the vertical first fins 31 will guide the fluid, and thus the fluid is more stable without turbulence forms.

As stated above, since the fluid flows through the first fins 31 and the second fins 32 with different inclined angles, the fluid flows at the flow channel D for more time to take heat away. The first fins 31 and the second fins 32 form the structure of the channel D with obstruction, so as to form more turbulent flows. Thus, the heat exchange efficiency of the first fins 31 and the second fins 32 is improved so as to increase the heat dissipating efficiency of the heat dissipating device 2.

Figure 3A:
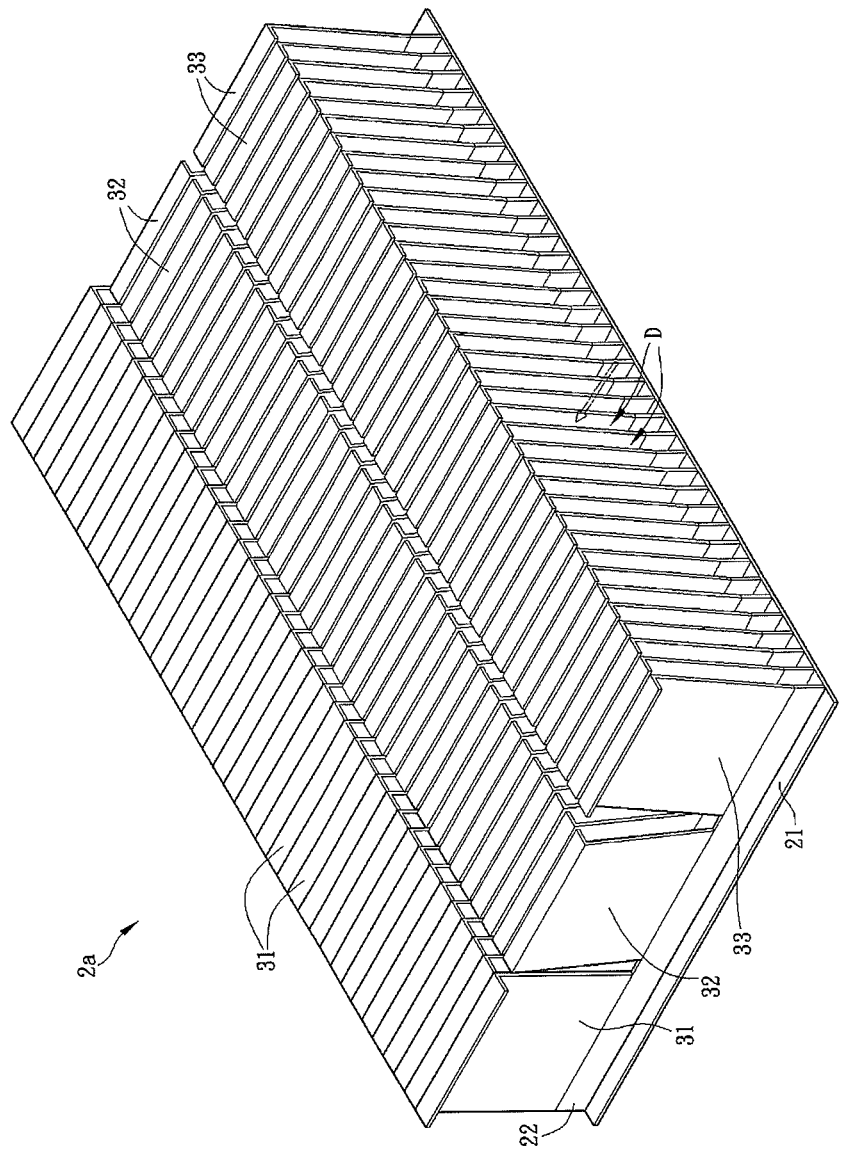
FIG. 3A and FIG. 3B are schematic diagrams showing a heat dissipating device and its fins, respectively, in a second embodiment.
Figure 3B:
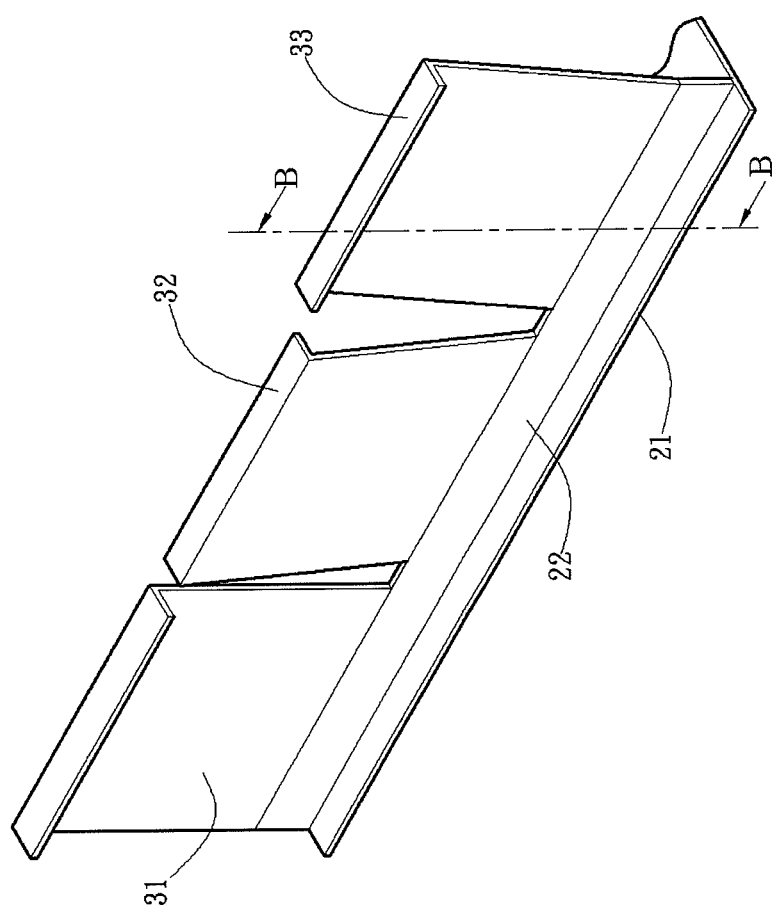

FIG. 3A and FIG. 3B are schematic diagrams showing a heat dissipating device 2a and its fins, respectively, in a second embodiment.

Comparing with the heat dissipating device 2 that mentioned above, the main difference is that the heat dissipating device 2a has two sets of inclined heat dissipating part. Similar, The inclined heat dissipating part forms by a plurality of third fins 33 disposed in an inclined array at the supporting part 21 via the connecting part 22, and the third fins 33 and the second fins 32 are disposed staggeredly and adjacent to each other correspondingly. In other words, each of the third fins 33 is inclined and disposed staggeredly to the corresponding and adjacent second fin 32, respectively.

Figure 3D:
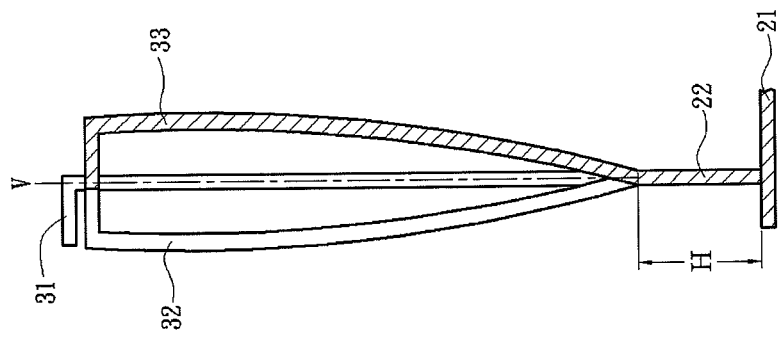
FIG. 3D is a sectional diagram showing a fin in FIG. 3B along a straight line B-B in a second embodiment.
Figure 3C:
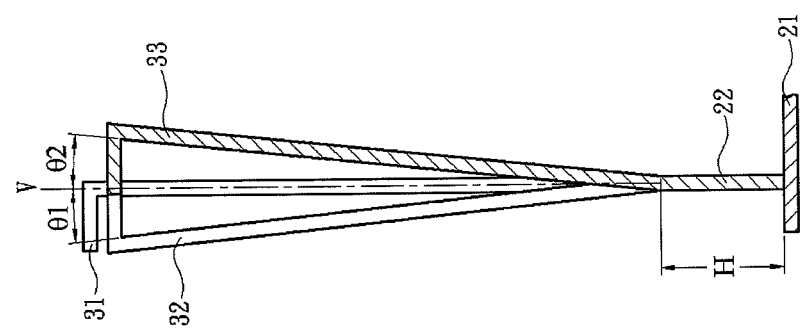
FIG. 3C is a sectional diagram showing a fin in FIG. 3B along a straight line B-B.

FIG. 3C is a sectional diagram showing a fin in FIG. 3B along a straight line B-B. The third fins 33 are inclined towards the right side, so that the second fins 32 and the third fins 33 are inclined relative to the first fins 31 and disposed staggeredly respect to the vertical first fins 31 at both sides. In FIG. 3D, the second fins 32 and the third fins 33 may be shaped in an arc, respectively (that is, the second fins 32 and the third fins 33 are inclined and with arc-shaped).

In FIG. 3C, a first angle θ1 is formed between the second fins 32 and the vertical plane V, and a second angle θ2 is formed between the third fins 33 and the vertical plane V. The first angle θ1 and the second angle θ2 may be between 5 degrees and 30 degrees. In the embodiment, both the first angle θ1 and the second angle θ2 are 6 degrees. However, in another embodiment, the first angle θ1 and the second angle θ2 may be different.

Figure 3E:
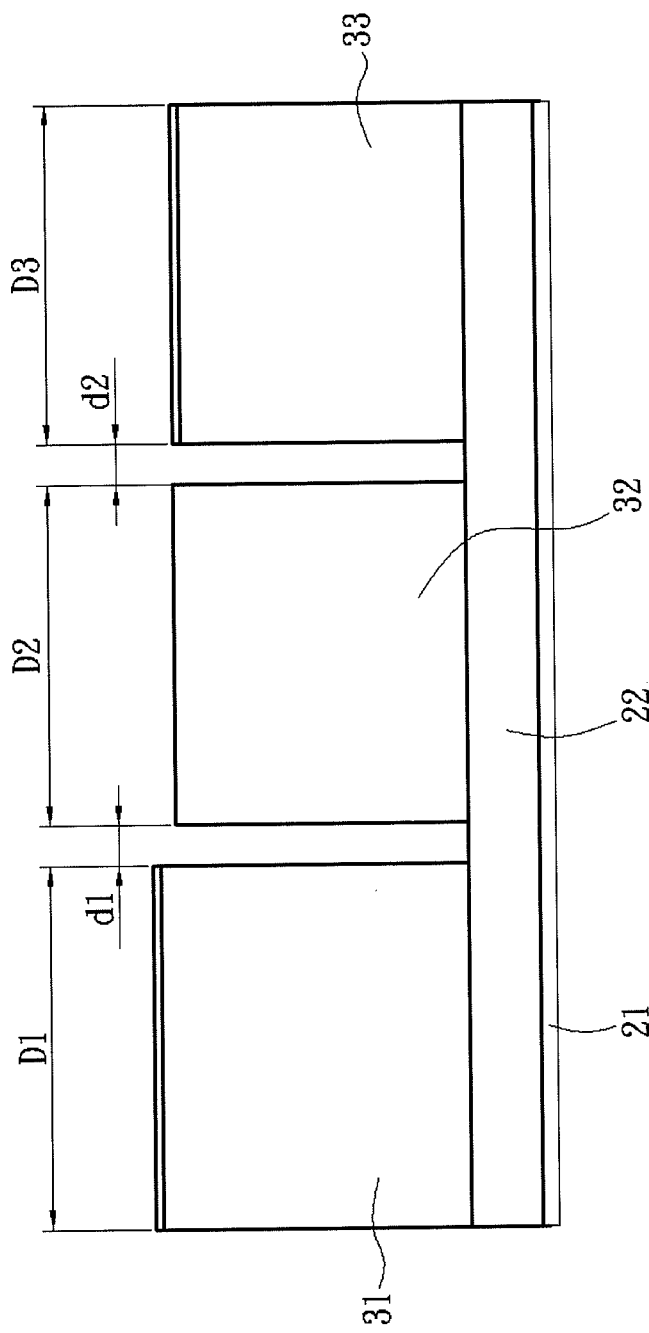
FIG. 3E is a side view showing a fin in FIG. 3B.

FIG. 3E is a side view showing a fin in FIG. 3B. Width D1, D2, D3 of the first fins 31, the second fins 32 and the third fins 33 may be between 2 mm to 15 mm, respectively. Interval distance d1 between the first fins 31 and the second fins 32, and interval distance d2 between the second fins 32 and the third fins 33 may be between 0.5 mm to 2 mm, respectively. However, the width D1, D2, D3 and the internal d1, d2 are not limited herein. Users can change the width D1, D2, D3 of the first fins 31, the second fins 32, the third fins 33 and the interval d1, d2 therebetween according to their requirements.

In FIG. 3A, the flow channel D is formed between two third fins 33, two second fins 32 and two first fins 31, the fluid enters the heat dissipating device 2a through the flow channel D, and takes the heat from the heat dissipating device 2a away.

The fluid may enter the flow channel D from one side of the third fins 33, flows through two third fins 33, two second fins 32 and two first fins 31 in sequence, and gets out of the heat dissipating device 2a from one side of the first fins 31. When the fluid flows through the third fins 33, the second fins 32 with different inclined angles, more turbulent flows are formed, so that the convection coefficient of the first fins 31, the second fins 32 and the third fins 33 is large. Consequently, the heat exchange efficiency of the first fins 31, the second fins 32 and the third fins 33 is improved so as to increase the heat dissipating efficiency of the heat dissipating device 2a.

Figure 4A:
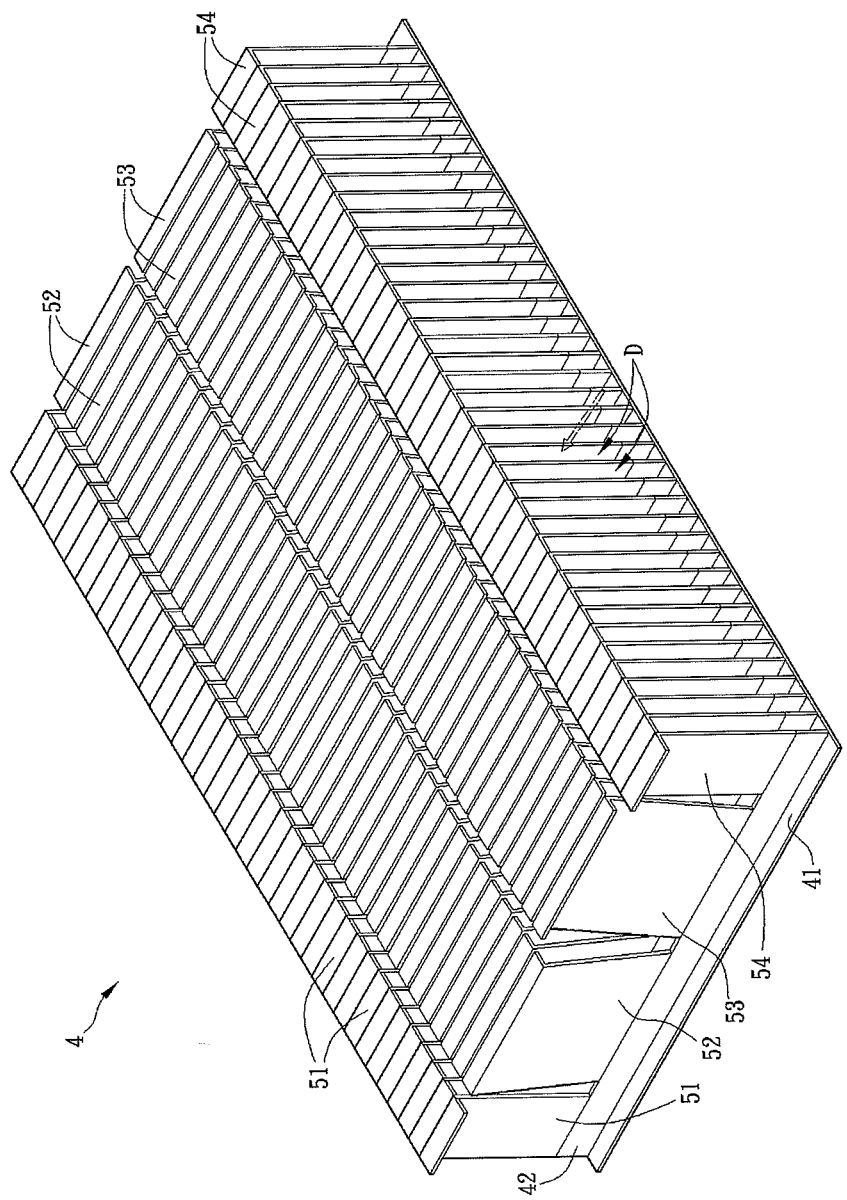
FIG. 4A and FIG. 4B are schematic diagrams showing a heat dissipating device and its fins, respectively, in a third embodiment.
Figure 4B:
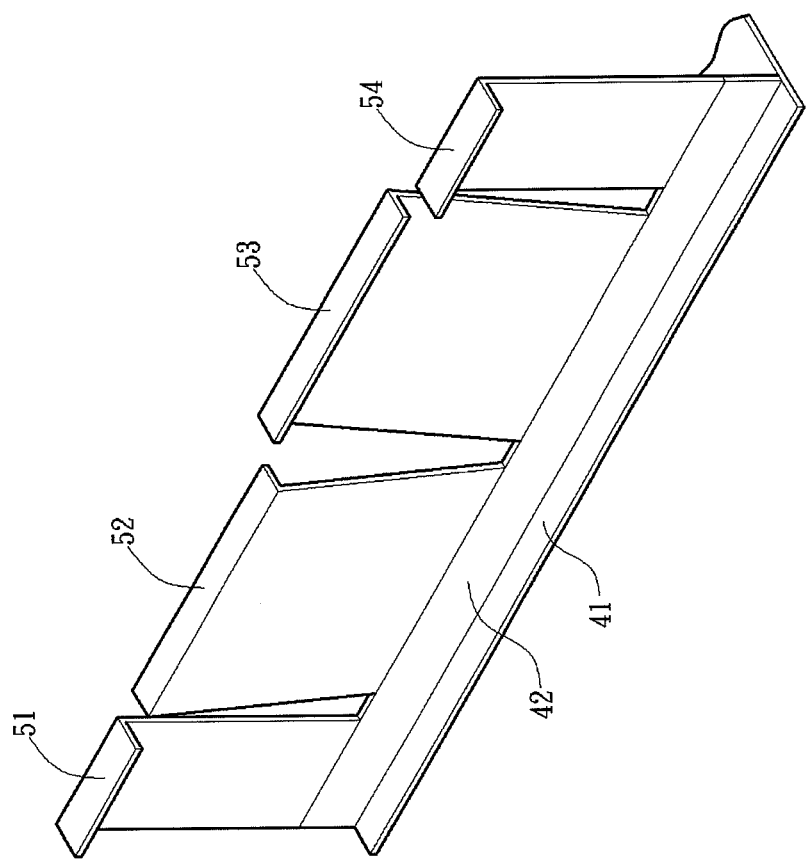

FIG. 4A and FIG. 4B are schematic diagrams showing a heat dissipating device 4 and its fins, respectively, in a third embodiment.

The heat dissipating device 4 includes a supporting part 41, a vertical heat dissipating part, two inclined heat dissipating parts and a connecting part 42. The vertical heat dissipating part includes a plurality of first fins 51, and the first fins 51 are disposed in a vertical array at the supporting part 41 via the connecting part 42. The two inclined heat dissipating parts are disposed adjacent to the vertical heat dissipating part and include a plurality of second fins 52 and third fins 53. The second fins 52 and the third fins 53 are disposed in an inclined array at the supporting part 41 via the connecting part 42, respectively. The first fins 51 and the second fins 52 are staggeredly disposed and adjacent to each other correspondingly, and the second fins 52 and the third fins 53 are staggeredly disposed and adjacent to each other correspondingly.

The main difference between the heat dissipating device 4 in FIG. 4A and the heat dissipating device 2a in FIG. 3A is that the heat dissipating device 4 further includes another vertical heat dissipating part. The second vertical heat dissipating part is disposed adjacent to the third fins 53 and includes a plurality of fourth fins 54 disposed in a vertical array at the supporting part 41 via the connecting part 42. The fourth fins 54 and the third fins 53 are staggeredly disposed and adjacent to each other correspondingly. Furthermore, the width of the first fins 51 and the fourth fins 54 in FIG. 4A is half of that of the first fins 31 in FIG. 3A.

Other technical characters of the heat dissipating device 4 can refer to those of the heat dissipating device 2a, respectively, which is omitted herein.

Figure 5:
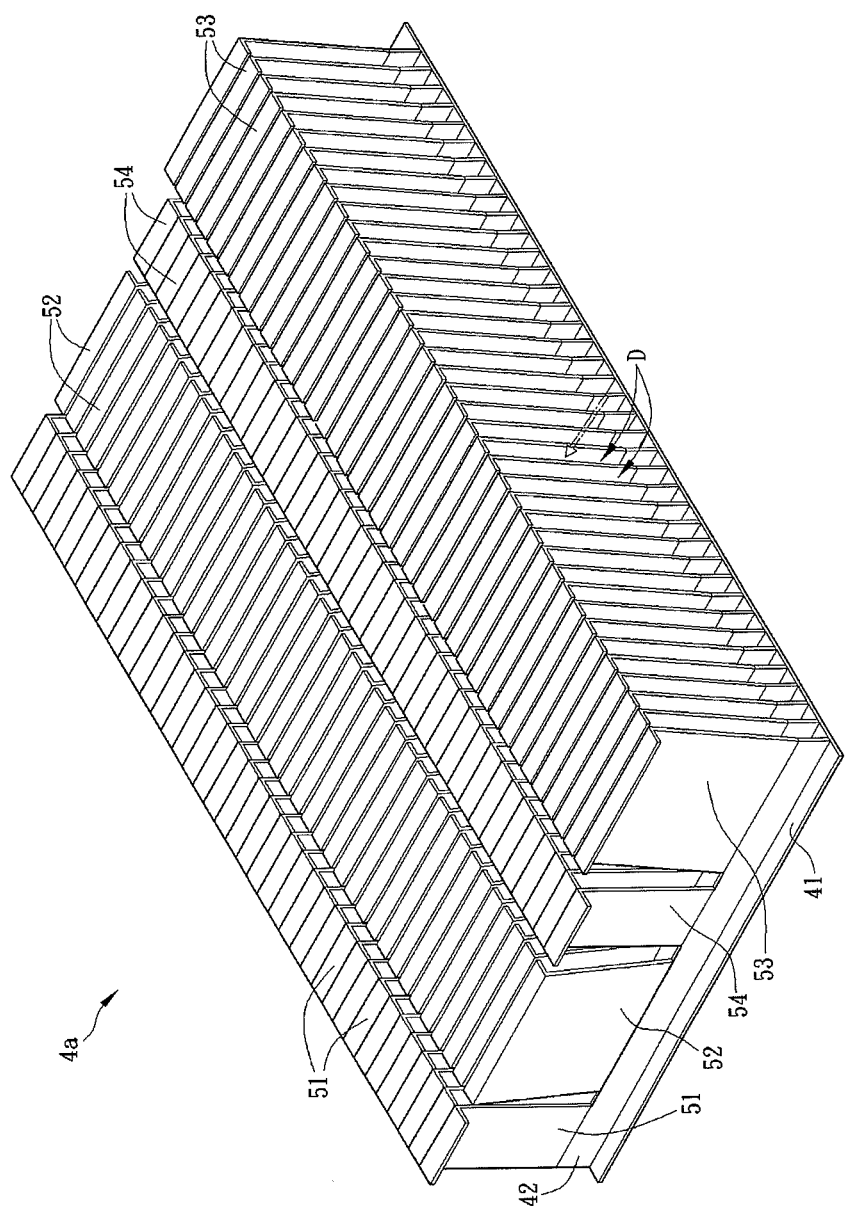
FIG. 5 is a schematic diagram showing a heat dissipating device in a fourth embodiment.

FIG. 5 is a schematic diagram showing a heat dissipating device in a fourth embodiment 4a.

The main difference between the heat dissipating device 4a in FIG. 5 and the heat dissipating device 4 in FIG. 4A is that the fourth fins 54 of the heat dissipating device 4a is disposed between the second fins 52 and the third fins 53.

Other technical characters of the heat dissipating device 4a can refer to those of the heat dissipating device 4 correspondingly, which is omitted herein.

In sum, the heat dissipating device includes a supporting part, a plurality of first fins and a plurality of second fins. The first fins are disposed in a vertical array at the supporting part, the second fins are disposed in an inclined array at the supporting part, and the first fins and the second fins are staggeredly disposed and adjacent to each other correspondingly. Thus, when fluid flows through the fins with different inclined angles, more turbulent flows are formed, so that the convection coefficient of the fins is larger. Consequently, the heat exchange efficiency of the fins is improved so as to increase the heat dissipating efficiency of the heat dissipating device.

Although the present invention has been described in considerable detail with reference to certain preferred embodiments thereof, the disclosure is not for limiting the scope. Persons having ordinary skill in the art may make various modifications and changes without departing from the scope. Therefore, the scope of the appended claims should not be limited to the description of the preferred embodiments described above.

What is claimed is:

1. A heat dissipating device, comprising:
    a supporting part;
    a plurality of connecting parts, wherein the connecting parts are disposed vertically on the supporting part;
    a plurality of first fins disposed in a vertical array at the connecting parts;
    a plurality of second fins inclined towards a first direction relative to the supporting part and disposed at the connecting parts; and
    a plurality of third fins inclined towards a second direction relative to the supporting part and disposed at the connecting parts, wherein the first direction is opposite to the second direction;
    wherein each of the connecting parts is directly connected with only one of the first fins, only one of the second fins and only one of the third fins,
    wherein the first fins and the second fins are staggeredly disposed and directly adjacent to each other correspondingly, and the second fins and the third fins are staggeredly disposed and directly adjacent to each other correspondingly.

2. The heat dissipating device according to claim 1, wherein the supporting part, the connecting part and the first fins are integratedly formed, or the supporting part, the connecting part and the second fins are integratedly formed.

3. The heat dissipating device according to claim 1, wherein a first angle is formed between the second fins and a vertical plane.

4. The heat dissipating device according to claim 1, wherein the first fins are staggeredly disposed relative to the inclined second fins.

5. The heat dissipating device according to claim 1, wherein the second fins are arc-shaped.

6. The heat dissipating device according to claim 1, wherein a flow channel is formed between two second fins and between two first fins.

* * * * *